(12) United States Patent
McIntyre et al.

(10) Patent No.: US 8,674,446 B2
(45) Date of Patent: Mar. 18, 2014

(54) ELECTRONIC DEVICE INCLUDING ELECTRICALLY CONDUCTIVE BODY FOR ESD PROTECTION AND RELATED METHODS

(75) Inventors: John Robert McIntyre, Rochester, NY (US); Andrew Mui, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 79 days.

(21) Appl. No.: 13/343,837

(22) Filed: Jan. 5, 2012

(65) Prior Publication Data

US 2013/0175628 A1 Jul. 11, 2013

(51) Int. Cl.
*H01L 27/04* (2006.01)
*H01L 21/50* (2006.01)

(52) U.S. Cl.
USPC ............. 257/355; 257/E27.06; 257/E21.499; 438/107

(58) Field of Classification Search
USPC ............. 257/355, E27.06, E21.499; 438/107
See application file for complete search history.

(56) References Cited

U.S. PATENT DOCUMENTS

| | | | |
|---|---|---|---|
| 4,504,886 A | 3/1985 | Cygan et al. | 361/386 |
| 5,844,312 A | 12/1998 | Hinshaw et al. | 257/718 |
| 6,128,190 A * | 10/2000 | Hardin et al. | 361/704 |
| 2006/0267218 A1 * | 11/2006 | Hozoji et al. | 257/782 |

* cited by examiner

*Primary Examiner* — Jarrett Stark
*Assistant Examiner* — Lawrence Tynes, Jr.
(74) *Attorney, Agent, or Firm* — Allen, Dyer, Doppelt, Milbrath & Gilchrist, P.A.

(57) ABSTRACT

An electronic device may include a transistor device including a transistor package and transistor terminals extending outwardly therefrom. The electronic device may also include an electrically conductive body removably coupled to and shorting together the transistor terminals for electrostatic discharge (ESD) protection.

21 Claims, 6 Drawing Sheets

ELECTRONIC DEVICE INCLUDING ELECTRICALLY CONDUCTIVE BODY FOR ESD PROTECTION AND RELATED METHODS

FIELD OF THE INVENTION

The present invention relates to the field of electronics devices and, more particularly, to electrostatic discharge (ESD) protection devices and related methods.

BACKGROUND OF THE INVENTION

Some types of electronic devices may be relatively sensitive to electrostatic discharge (ESD). In particular, transistor devices, for example, a radio frequency (RF) power transistor, may be increasingly sensitive to ESD. An ESD as low as 250 volts may destroy the transistor device or damage the transistor device so that is fails.

A transistor device may be most susceptible to ESD damage during handling, which may include, for example, packaging by the manufacturer, removal from the manufacturer's packaging, and/or installation in a an electronic circuit. A transistor device may be most susceptible to damage from gate-to-source and drain-to-source potentials, for example. Typically gate structures may be are most sensitive to ESD.

Several techniques for reducing the potential for ESD damage focus on a workstation, for example, where a transistor device is installed into the electronic circuit. In particular, grounding fixtures, which may include grounding clips may be used to reduce ESD. ESD dissipative mats are another type of ESD reduction technique. Wrist straps and smocks are types of ESD reduction devices worn by a user, for example, during installation of the transistor device. Environmental devices, such as, for example, an ionizer and a humidity control device are also types of ESD reduction devices.

Other techniques for reducing potential for ESD damage are directed to the packaging of the transistor device. Conductive packaging may protect the transistor device during transportation. Conductive packaging may include, for example, conductive ESD bags, and conductive cardboard or plastic trays. However, the transistor device is eventually removed from the conductive packaging prior to being installed, which may expose the transistor device to ESD damage.

Additionally, after the transistor device is installed in an electronic circuit, for example, to improve the chassis to printed circuit board (PCB) ground connection one or more ground tabs may be installed. The ground tabs may be installed under flange screws and soldered to the PCB, for example.

SUMMARY OF THE INVENTION

In view of the foregoing background, it is therefore an object of the present invention to reduce the possibility of ESD damage during transport and/or installation of a transistor device.

This and other objects, features, and advantages in accordance with the present invention are provided by an electronic device that includes a transistor device including a transistor package and a plurality of transistor terminals extending outwardly therefrom. The electronic device also includes an electrically conductive body removably coupled to and shorting together the plurality of transistor terminals for electrostatic discharge (ESD) protection. Accordingly, the electronic device provides increased ESD protection, for example, during transport and installation.

The electrically conductive body may include a plurality of spring biased legs to removably couple to respective ones of the plurality of transistor terminals. The plurality of transistor terminals may include a first conduction terminal at a bottom surface of the transistor package, and may include a mounting flange having opposing first and second flange portions extending outwardly from opposing first and second sides of the transistor package, for example. The transistor terminals may also include a second conduction terminal extending outwardly from a first end of the transistor package, and a control terminal extending outwardly from a second end of the transistor package opposite the first end. The electrically conductive body may include a top covering an upper surface of the transistor package, and a plurality of legs extending downwardly therefrom to removably couple to respective ones of the transistor terminals.

A method aspect is directed to a method of electrostatic discharge (ESD) protection for a transistor device including a transistor package and a plurality of transistor terminals extending outwardly therefrom. The method includes coupling an electrically conductive body to and shorting together the plurality of transistor terminals for electrostatic discharge (ESD) protection.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
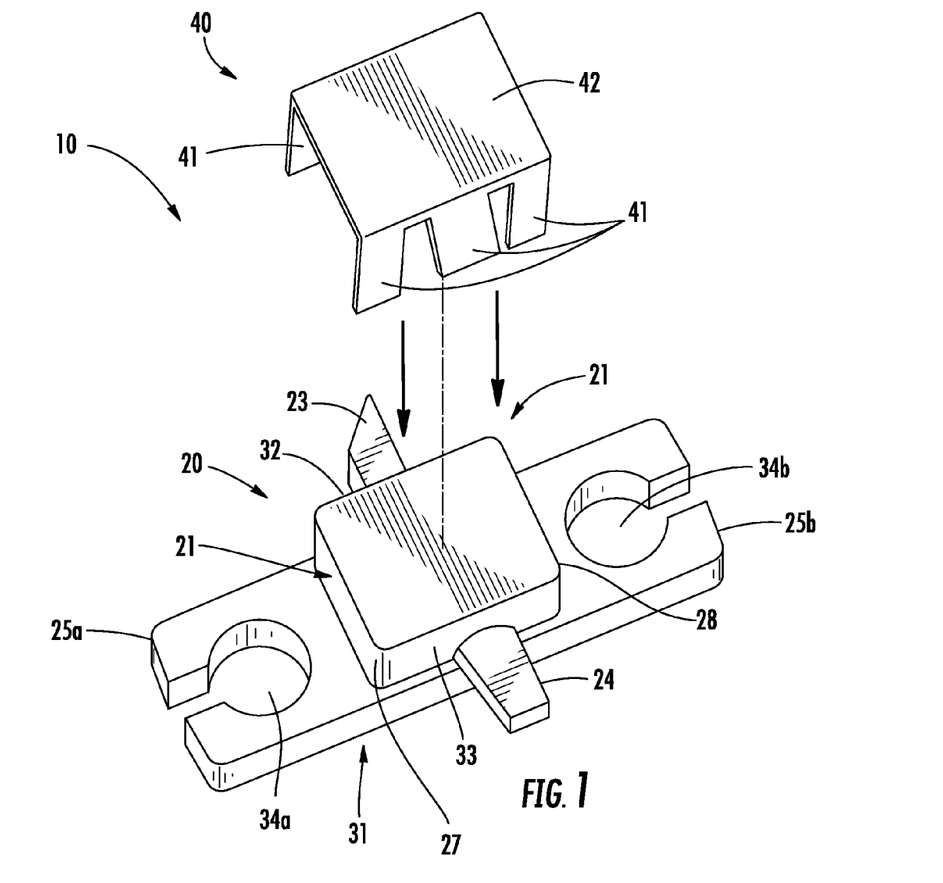
FIG. 1 is a perspective exploded view of an electronic device according to the present invention.
Figure 2:
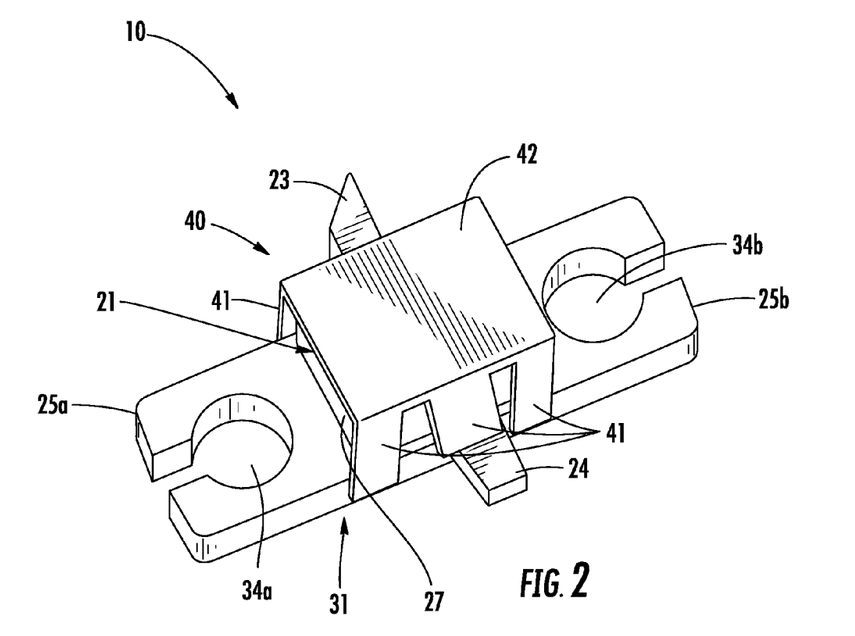
FIG. 2 is a perspective assembled view of the electronic device of FIG. 1

Referring initially to FIGS. 1 and 2, an electronic device 10 illustratively includes a transistor device 20. The transistor device 20 includes a transistor package 21 and a first conduction terminal, for example, a source terminal, at a bottom surface of the transistor package in the form of the mounting flange 31. The mounting flange 31 has opposing first and second flange portions 25a, 25b extending outwardly from the opposing first and second sides 27, 28 of the transistor package 21. Each of the first and second flange portions 25a, 25b illustratively has a flange opening 34a, 34b therein. Each flange opening 34a, 34b may be for fastening the transistor package 21 to a printed circuit board (PCB) or heat sink, for example. More particularly, a mechanical fastener, for example, a bolt may pass through each flange opening 34a, 34b to secure the transistor package 21.

A second conduction terminal 23, for example, a drain terminal, extends outwardly from a first end 32 of the transistor package 21. A control terminal 24, for example, a gate terminal, extends outwardly from a second end 33 of the transistor package 21 opposite the first end 32.

Illustratively, the transistor device 20 is in the form of a power transistor. In particular, the transistor device 20 may be particularly useful for broadband applications, for example, at frequencies in the range of 400-3000 MHz. For example, the transistor device 20 may be an NPTB00025 gallium nitride 28 Volt, 25 Watt high electron mobility transistor available from Nitronex Corporation of Raleigh, N.C. Of course, the transistor device 20 may be another type of transistor device, for example, a bipolar junction transistor device. For bipolar transistors, the terminals of the transistor device may be a base, collector, and emitter.

The electronic device 10 also includes an electrically conductive body 40 removably coupled to and shorting together the conduction terminals 31, 23 and the control terminal 24 of the transistor device 20. Advantageously, the shorting together of the conduction terminals 31, 23 and the control terminal 24 reduces the susceptibility of the transistor device 20 to ESD damage. In other words, the shorting together of the conduction terminals 31, 23 and the control terminal 24 increases ESD protection.

The electrically conductive body 40 may be metal. For example, the electrically conductive body 40 may include steel, tin, and/or lead. The electrically conductive body 40 may include other or additional metals, or may be an electrically conductive plastic material.

The electrically conductive body 40 illustratively includes a top 42 and spring biased legs 41 that extend downwardly from the top to removably couple to respective ones of conduction terminals 31, 23 and the control terminal 24. In particular, six spring biased legs 41, three adjacent the first end 32 and three adjacent the second end 33 of the transistor package, extend downwardly from the top 42 to removably couple to respective ones of the conduction terminals 31, 23 and the control terminal 24 (FIG. 2).

Of the three spring biased legs 41 adjacent the first end 32, the middle leg couples to the second conduction terminal 23, in particular, the drain terminal. The two outer spring biased legs couple to the first conduction terminal, i.e., the source terminal which is also the mounting flange 31.

Of the three spring biased legs 41 adjacent the second end 33, the middle leg couples to the control terminal 24, in particular, the gate terminal. The two outer spring biased legs also couple to the first conduction terminal provided by the mounting flange 31.

The top 42 of the electrically conductive body 40 is advantageously carried by an upper surface of the transistor package 21. As will be appreciated by those skilled in the art, the spring biased legs 41 provide tension to the transistor package 21 and terminals 31, 23 and 24 to assist in holding the electrically conductive body 40 in place during transportation and installation. An adhesive layer may be between the upper surface of the transistor package 21 and the top 42 of the electrically conductive body 40 to further assist in keeping the electrically conducive body in place.

The electrically conductive body 40 may be installed by the manufacturer, for example. To increase ESD protection, the electrically conductive body 40 would remain coupled to and short the conduction terminals 31, 23 and the control terminal 24, during installation and handling. Additionally, the electrically conductive body 40 does not obstruct the mounting flange 31, and thus, installation of the transistor device 20 onto a PCB, for example, for installation via a pair of mechanical fasteners.

Referring now to FIGS. 3-6, another embodiment of the electronic device 10' is illustrated. The electronic device 10' may a wireless communications device and includes a PCB 35' and electronic circuitry 36', for example, wireless communications circuitry, carried by the PCB. The transistor device 20' is also carried by the PCB and coupled to the electronic circuitry 36'.

Figure 3:
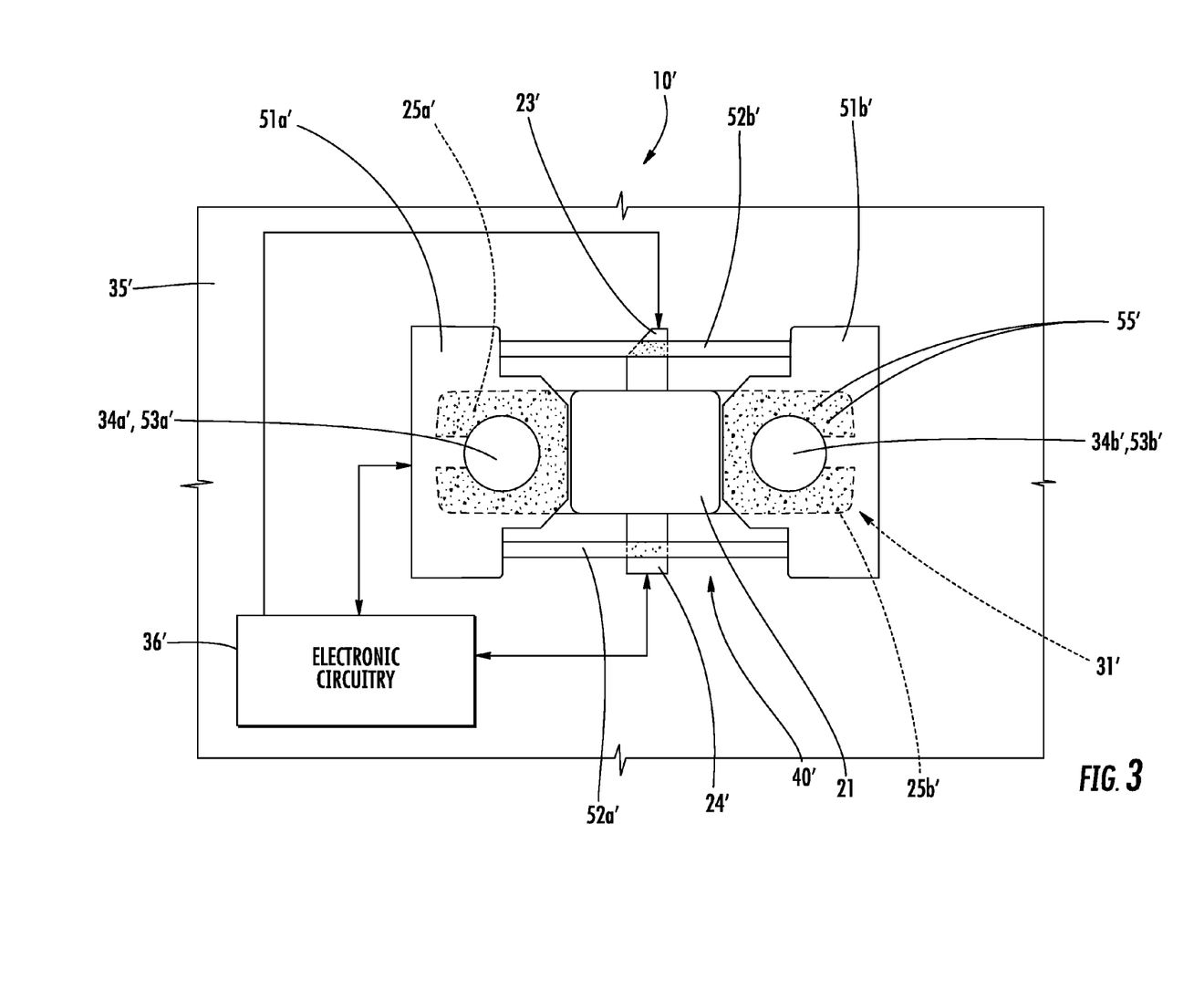
FIG. 3 is a schematic diagram of an electronic device including electronic circuitry according to another embodiment of the invention.
Figure 4:
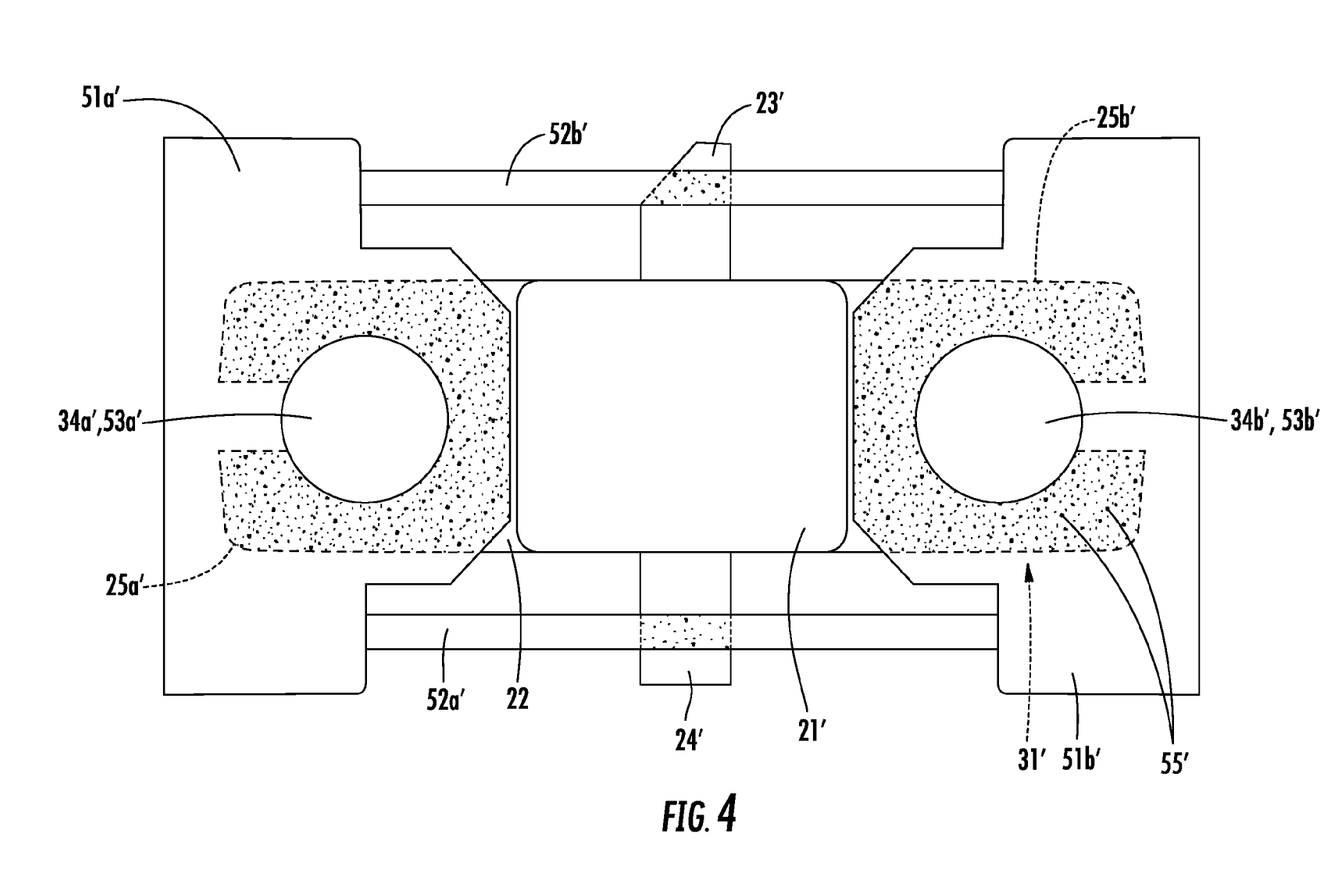
FIG. 4 is an enlarged plan view of the electrically conductive body and transistor device of FIG. 3.
Figure 5:
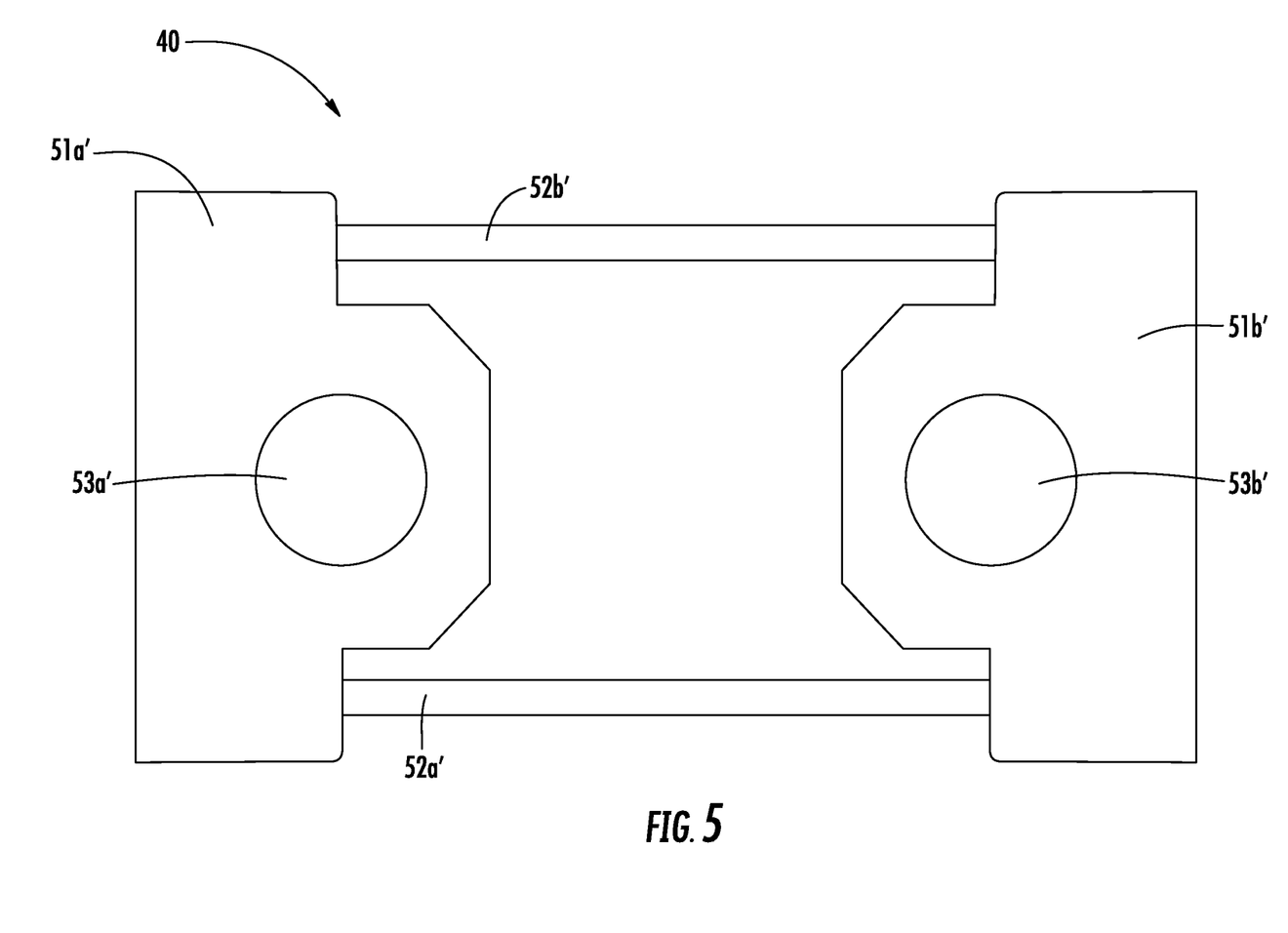
FIG. 5 is an enlarged plan view of the electrically conductive body of FIG. 3.

The electrically conductive body 40' includes a pair of base members 51a', 51b' that are electrically conductive. In particular, a first base member 51a', 51b' is coupled to the first flange portion 25a'. A second base member 51a', 51b' is coupled to the second flange portion 25b'. The first and second base members 51a', 51b' are illustratively carried on a top of the first and second flange members 25a', 25b', respectively.

A first severable shorting link 52a' extends between the first and second base members 51a', 51b' and contacts the control terminal 24', i.e. the gate terminal. A second severable shorting link 52b' extends between the first and second base members 51a', 51b' and contacts the second conduction terminal 23', i.e. the drain terminal. Each severable shorting link 52a', 52b' may be metal or other conductive material.

An adhesive layer 55' may couple the first and second base members 51a', 51b' to the first and second flange portions 25a', 25b', respectively. The adhesive layer 55' may also couple the first and second severable shorting links 52a', 52b' to the conduction terminal 22', i.e. drain, and control terminal 24', i.e., gate, respectively. The adhesive layer 55' may advantageously maintain electrical coupling between the electrically conductive body 40' and the conduction terminals 31', 23' and the control terminal 24' so that they remain shorted from the manufacturer through installation. The adhesive layer 55' may be a thin layer of solder, or an electrically conductive epoxy, for example. Of course, the adhesive layer 55' may be another type of electrically conductive adhesive.

Similar to the embodiment described above with respect to FIGS. 1 and 2, the electrically conductive body 40' may be installed by the manufacturer, for example. To increase ESD protection, the electrically conductive body 40' would remain coupled to the conduction terminals 31', 23' and the control terminal 24', during installation and handling.

The first and second severable shorting links 52a', 52b' advantageously link the first and second base members 51a', 51b' so that the electrically conductive body 40' is a single or monolithic body. This may increase the ease of installation.

Additionally, the first and second base members 51a', 51b' have corresponding base member openings 53a', 53b' therein aligned with the respective flange openings 34a', 34b'. Thus, the electrically conductive body 40' does not interfere with installation of the transistor device 20' into a PCB 35', for example, via a mechanical fastener. This, in turn, may also aid in the alignment of the transistor device 20' on the PCB 36', or a chassis, and further secure the electrically conductive body 40' to the transistor device, for example.

Figure 6:
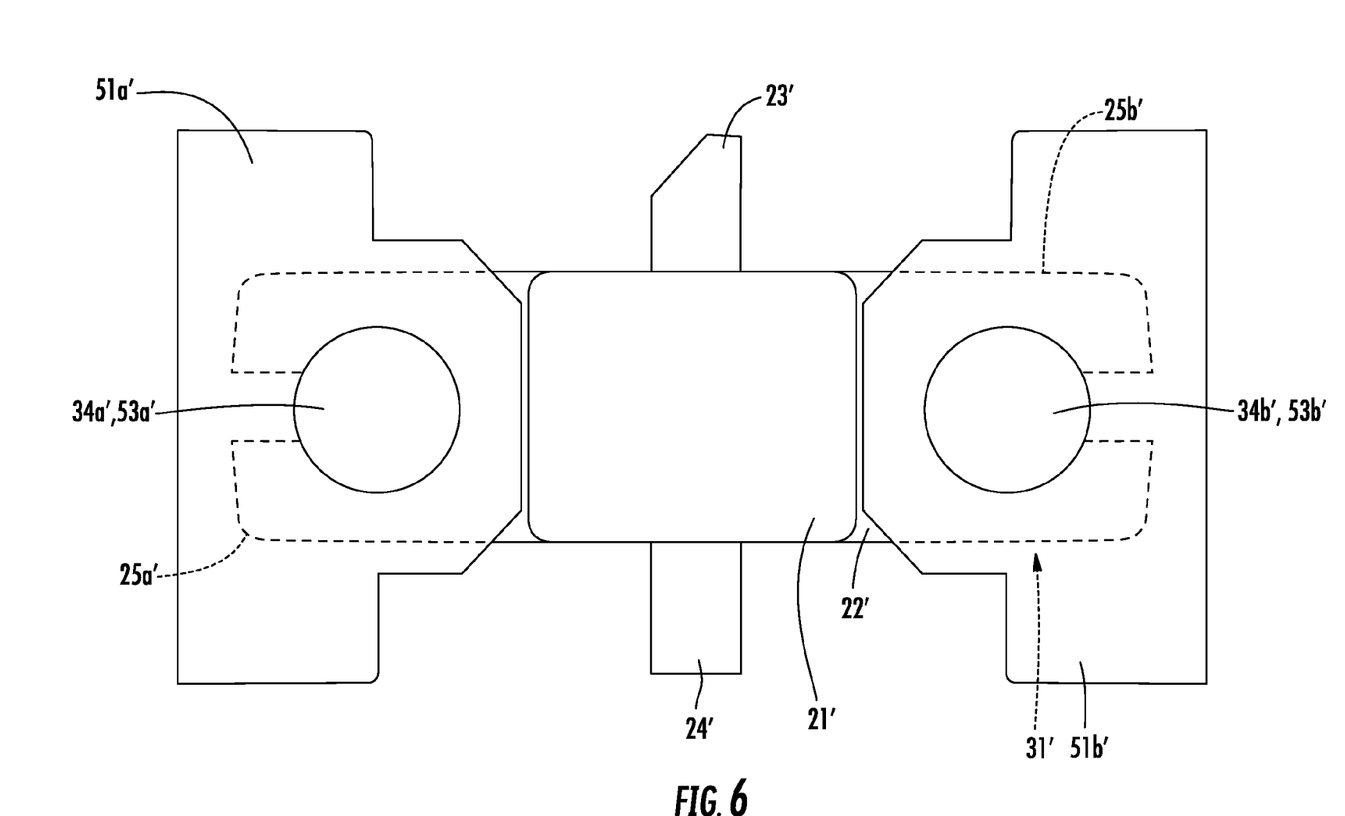
FIG. 6 is an enlarged plan view of the electrically conductive body of FIG. 4 with the severable shorting links removed.

After installation, and, for example, after being secured to the PCB 35', and before applying power to the transistor device 20' the first and second severable links 52a', 52b' are removed (FIG. 6). The first and second severable links 52a', 52b' may be removed by cutting away, for example, the first and second severable links from between the first and second base members 51a', 51b'. Accordingly, the transistor device 20' may have increased ESD protection when it may be most vulnerable, for example, during installation. Moreover, the increased ESD protection reduces interfere with the installation, and thus may provide up to a 50% reduction in manual operations as compared to prior art ESD protection approaches. Moreover, use of the electrically conductive body 40' may reduce ESD related latent failures of the transistor device 20', which typically lead to costly repairs.

When used in a wireless communications device, and coupled to the electronic circuitry 36', the conduction terminal 31' grounding provided by the first and second base members 51a', 51b' is another feature provided by the electrically conductive body 40'. In particular, the ground return path for the transistor device 20' is typically through a chassis and the PCB 35'. The conduction terminal 31', resistance and inductance introduced by the ground path may influence the gain of the transistor device 20' at relatively high frequencies, for example. The electrically conductive body 40' advantageously reduces the effect of conduction terminal 31' parasitics, for example, by 2-3 dB, by shorting them to the ground, in addition to providing increased ESD protection. In other words, the manual step of adding a conduction terminal grounding clip may not be needed, as the electrically conductive body 40' advantageously shorts the conduction terminal 31' to ground.

A method aspect is directed to a method of electrostatic discharge (ESD) protection for a transistor device 20, 20' that includes a transistor package 21, 21' and transistor terminals 31, 31', 23, 23', 24, 24' extending outwardly from the transistor package. The method includes coupling the electrically conductive body 40, 40' to and shorting together the transistor terminals for electrostatic discharge (ESD) protection.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
    a transistor device comprising a transistor package and a plurality of transistor terminals extending outwardly therefrom; and
    an electrically conductive body removably coupled to and shorting together said plurality of transistor terminals.

2. The electronic device of claim 1, wherein said electrically conductive body comprises a plurality of spring biased legs removably coupled to respective ones of said plurality of transistor terminals.

3. The electronic device of claim 2, wherein said plurality of transistor terminals comprises:
    a first conduction terminal at a bottom surface of said transistor package and comprising a mounting flange having opposing first and second flange portions extending outwardly from opposing first and second sides of said transistor package;
    a second conduction terminal extending outwardly from a first end of said transistor package; and
    a control terminal extending outwardly from a second end of said transistor package opposite the first end.

4. The electronic device of claim 3, wherein said electrically conductive body comprises a top covering an upper surface of said transistor package; and wherein said plurality of legs extend downwardly from said top to removably couple to respective ones of said plurality of transistor terminals.

5. The electronic device of claim 1, wherein said electrically conductive body comprises at least one base member and at least one severable shorting link coupled thereto.

6. The electronic device of claim 5, wherein said plurality of transistor terminals comprises:
    a first conduction terminal at a bottom surface of said transistor package and comprising a mounting flange having opposing first and second flange portions extending outwardly from opposing first and second sides of said transistor package;
    a second conduction terminal extending outwardly from a first end of said transistor package; and
    a control terminal extending outwardly from a second end of said transistor package opposite the first end.

7. The electronic device of claim 6, wherein said at least one base member comprises a first base member coupled to said first flange portion; and a second base member coupled to said second flange portion.

8. The electronic device of claim 7, wherein said at least one severable shorting link comprises:
    a first severable shorting link extending between said first and second base members and contacting said control terminal; and
    a second severable shorting link extending between said first and second base members and contacting said second conduction terminal.

9. The electronic device of claim 7,
    further comprising an adhesive layer removably coupling said first and second base members to said first and second flange portions, respectively.

10. The electronic device of claim 7, wherein each of said first and second flange portions has a flange opening therein; and wherein each of said first and second base members has a corresponding base member opening therein aligned with a respective flange opening.

11. An electronic device comprising:
    a transistor device comprising
        a transistor package,
        a source terminal at a bottom surface of said transistor package and comprising a mounting flange having opposing first and second flange portions extending outwardly from opposing first and second sides of said transistor package,
        a drain terminal extending outwardly from a first end of said transistor package, and
        a gate terminal extending outwardly from a second end of said transistor package opposite the first end; and
    a metallic body comprising a plurality of spring biased legs removably coupled to respective ones of and shorting together said source, gate, and drain terminals.

12. The electronic device of claim 11, wherein said metallic body comprises a top covering an upper surface of said transistor package; and wherein said plurality of legs extend downwardly from said top and removably coupled to respective ones of said source, gate, and drain terminals.

13. An electronic device comprising:
    a transistor device comprising
        a transistor package,
        a source terminal at a bottom surface of said transistor package and comprising a mounting flange having opposing first and second flange portions extending outwardly from opposing first and second sides of said transistor package,
        a drain terminal extending outwardly from a first end of said transistor package, and
        a gate terminal extending outwardly from a second end of said transistor package opposite the first end; and a metallic body comprising at least one base member and at least one severable shorting link coupled thereto and shorting together said source, gate, and drain terminals.

14. The electronic device of claim 13, wherein said at least one base member comprises a first base member coupled to said first flange portion; and a second base member coupled to said second flange portion.

15. The electronic device of claim 14, wherein said at least one severable shorting link comprises:
   a first severable shorting link extending between said first and second base members and contacting said gate terminal; and
   a second severable shorting link extending between said first and second base members and contacting said drain terminal.

16. A method of providing electrostatic discharge (ESD) protection for a transistor device comprising a transistor package and a plurality of transistor terminals extending outwardly therefrom, the method comprising:
   coupling an electrically conductive body to and shorting together the plurality of transistor terminals.

17. The method of claim 16, wherein coupling the electrically conductive body comprises coupling a plurality of spring biased legs to respective ones of the plurality of transistor terminals.

18. The method of claim 17, wherein the plurality of transistor terminals comprises a first conduction terminal at a bottom surface of the transistor package and comprising a mounting flange having opposing first and second flange portions extending outwardly from opposing first and second sides of the transistor package, a second conduction terminal extending outwardly from a first end of the transistor package, and a control terminal extending outwardly from a second end of the transistor package opposite the first end; and wherein coupling the electrically conductive body comprises coupling a top to cover an upper surface of the transistor package so that the plurality of legs extend downwardly from the top and removably couple to respective ones of the plurality of transistor terminals.

19. The method of claim 16, wherein coupling the electrically conductive body comprises coupling at least one base member and at least one severable shorting link coupled thereto.

20. The method of claim 19, wherein the plurality of transistor terminals comprises a first conduction terminal at a bottom surface of the transistor package and comprising a mounting flange having opposing first and second flange portions extending outwardly from opposing first and second sides of the transistor package, a second conduction terminal extending outwardly from a first end of the transistor package, and a control terminal extending outwardly from a second end of the transistor package opposite the first end; and wherein coupling the at least one base member comprises coupling a first base member to the first flange portion and coupling a second base member to the second flange portion.

21. The method of claim 20, wherein coupling the at least one severable shorting link comprises:
   coupling a first severable shorting link to extend between the first and second base members and to contact the control terminal; and
   coupling a second severable shorting link to extend between the first and second base members and contact the second conduction terminal.

* * * * *